United States Patent
Kanamori (10) Patent No.: US 8,432,141 B2
(45) Date of Patent: Apr. 30, 2013

(54) INPUT VOLTAGE CONTROL CIRCUIT USING TWO DIFFERENTIAL AMPLIFIERS TO REGULATE OPERATING VOLTAGE

(75) Inventor: Motoki Kanamori, Takahama (JP)

(73) Assignee: DENSO CORPORATION, Kariya (JP)

( * ) Notice: Subject to any disclaimer, the term of this patent is extended or adjusted under 35 U.S.C. 154(b) by 263 days.

(21) Appl. No.: 13/036,112

(22) Filed: Feb. 28, 2011

(65) Prior Publication Data

US 2011/0215785 A1    Sep. 8, 2011

(30) Foreign Application Priority Data

Mar. 2, 2010 (JP) .................................. 2010-45708

(51) Int. Cl.
G05F 1/40 (2006.01)
G05F 1/44 (2006.01)

(52) U.S. Cl.
USPC ........... 323/223; 323/222; 323/282; 323/284; 323/286

(58) Field of Classification Search ............ 323/222, 323/223, 282, 284, 286
See application file for complete search history.

(56) References Cited

U.S. PATENT DOCUMENTS

| | | | | |
|---|---|---|---|---|
| 5,982,160 | A * | 11/1999 | Walters et al. | 323/282 |
| 6,441,597 | B1 * | 8/2002 | Lethellier | 323/282 |
| 6,642,696 | B2 * | 11/2003 | Tateishi | 323/222 |
| 6,933,706 | B2 * | 8/2005 | Shih | 323/222 |
| 7,091,711 | B2 * | 8/2006 | Yoshida et al. | 323/282 |
| 7,095,218 | B2 * | 8/2006 | Kobayashi | 323/282 |
| 7,109,693 | B2 * | 9/2006 | Yoshida et al. | 323/282 |
| 2006/0082353 | A1 * | 4/2006 | Solivan et al. | 323/282 |
| 2008/0054865 | A1 * | 3/2008 | You et al. | 323/271 |
| 2008/0180075 | A1 * | 7/2008 | Xie et al. | 323/282 |
| 2009/0128222 | A1 * | 5/2009 | Zeng et al. | 327/512 |
| 2009/0134857 | A1 * | 5/2009 | Zeng et al. | 323/282 |

FOREIGN PATENT DOCUMENTS

JP  A-2004-302999  10/2004
JP  A-2008-206271  9/2008

OTHER PUBLICATIONS

"Voltage Regulator-Down (VRD) 11.0", *Processor Power Delivery Design Guidelines* for Desktop LGA775 Socket, Intel Corp., pp. 27-28, Nov. 2006, (Discussed on p. 2 of the specification).

* cited by examiner

*Primary Examiner* — Bao Q Vu (74) *Attorney, Agent, or Firm* — Posz Law Group, PLC (57) ABSTRACT

A voltage control system is configured with a constant voltage circuit, a semiconductor package and a power supply package. A power supply chip of the power supply package is configured to control the constant voltage circuit based on an input voltage supplied to the semiconductor package and an operating voltage of a semiconductor device so that the input voltage decreases as the voltage difference between the input voltage and the operating voltage increases.

6 Claims, 7 Drawing Sheets

| FB1-FB2 | SWITCHING (FREQUENCY) | INPUT VOLTAGE |
|---|---|---|
| 0.1 [V] (LARGE) | FAST (HIGH) | 1.0 [V] |
| 0.05 [V] (SMALL) | SLOW (LOW) | 1.2 [V] |

| FB1-FB2 | SWITCHING (FREQUENCY) | INPUT VOLTAGE |
|---|---|---|
| 0.1 [V] (LARGE) | FAST (HIGH) | 1.0 [V] |
| 0.05 [V] (SMALL) | SLOW (LOW) | 1.2 [V] |
| FB3-FB4 | SWITCHING (FREQUENCY) | INPUT VOLTAGE |
| 0.15 [V] (LARGE) | FAST (HIGH) | 1.75 [V] |
| 0.05 [V] (SMALL) | SLOW (LOW) | 1.9 [V] |

FIG. 8

FIG. 9 PRIOR ART (a) A (Vth:HIGH)  (b) B (Vth:LOW)  (c) B (Vth:LOW)

FIG. 10 PRIOR ART

INPUT VOLTAGE CONTROL CIRCUIT USING TWO DIFFERENTIAL AMPLIFIERS TO REGULATE OPERATING VOLTAGE

CROSS REFERENCE TO RELATED APPLICATION

This application is based on and incorporates herein by reference Japanese patent application No. 2010-45708 filed on Mar. 2, 2010.

FIELD OF THE INVENTION

The present invention relates to a voltage control system having a voltage control circuit for controlling a constant voltage circuit, which supplies electric power to a semiconductor package integrating therein semiconductor chips of semiconductor devices.

BACKGROUND OF THE INVENTION

It is known that, in a semiconductor chip manufactured by advanced semiconductor process of a design rule of less than 90 nm, power consumption of a semiconductor device corresponds to a sum of operating power and leak power.

The operating power depends on a magnitude of an input voltage to the semiconductor chip and rarely varies among semiconductor chips depending on variation in the semiconductor manufacturing process. The operating power and the power consumption of the semiconductor device increase as the input voltage of the same increases.

The leak power depends on current characteristic of the semiconductor chip, that is, a magnitude of a threshold voltage of a transistor. The leak power therefore varies among semiconductor chips depending on variation in the semiconductor manufacturing process. Since a leak current increases as the threshold voltage decreases, a semiconductor chip having larger leak power has better switching characteristic in comparison with a semiconductor chip having smaller leak power.

It is therefore possible to reduce the power consumption of the semiconductor chip and maintain a switching frequency of the semiconductor chip substantially unchanged, by lowering the input voltage of a semiconductor chip having larger leak power to be less than that of a semiconductor chip having smaller leak power.

Figure 9:
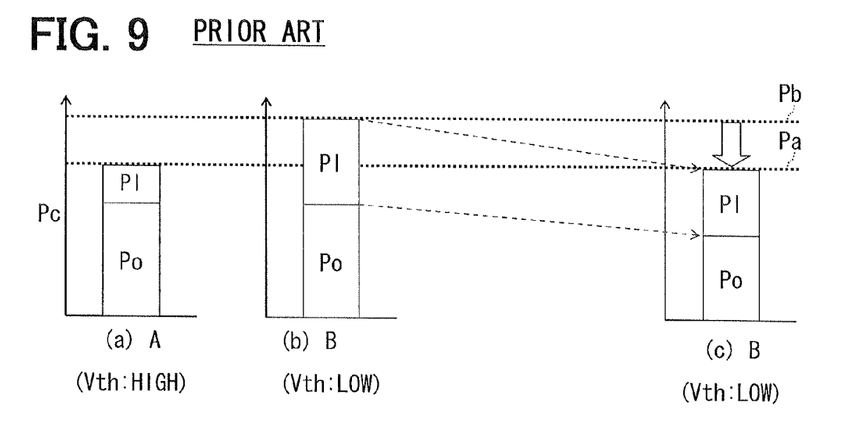
FIG. 9 is a graph showing power consumption of different samples manufactured by a same semiconductor manufacturing process.

This is described in more detail with reference to FIG. 9. In FIG. 9, (a) and (b) schematically show details of power consumption Pc as a sum of operating power Po and leak power Pl with respect to two semiconductor chip samples A and B, respectively. It is assumed that the samples A and B are manufactured by the same manufacturing process, that the leak powers Pl of the samples A and B are assumed to be small and large, respectively, and that same input voltages are applied to the samples A and B.

As understood from (a) and (b) of FIG. 9, the operating powers Po are generally the same between the samples A and B but the sample B has larger leak power Pl than the sample A. Therefore, the threshold voltage Vth of the sample B is lower than that of the sample A, and a limit value of an operating frequency (that is, operable switching frequency) of the sample B is higher than that of the sample A.

Figure 8:
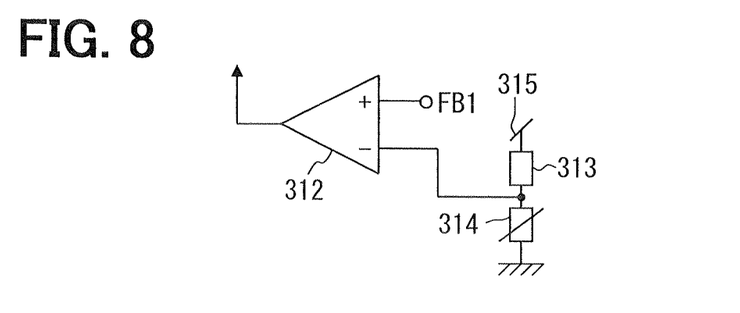
FIG. 8 is a circuit diagram showing a part of the voltage control circuit as a modification in the fourth embodiments of the present invention.

It is thus proposed to lower the input voltage to the sample B so that its power consumption Pc is lowered from a power level Pb to a power level Pa of the sample A as shown by (c) in FIG. 8, while maintaining the limit value of its operating frequency at generally the same limit value of the operating frequency of sample A.

This technology (VID: dynamic-voltage identification), which uses the above-described chip characteristic, is disclosed in the following non-patent document.

Intel Corp., "Voltage Regulator-Down (VRD) 11.0", pp. 27-28, November, 2006

Figure 10:
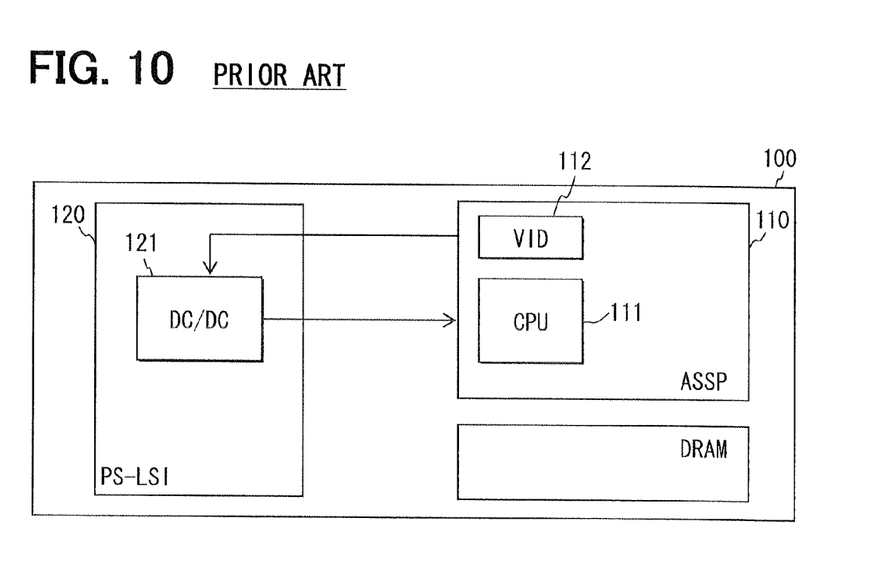
FIG. 10 is a block diagram schematically showing a conventional voltage control system.

According to this VID technology, as shown in FIG. 10, a voltage control system 100 is configured with a semiconductor package 110 and a power supply LSI (PS-LSI) 120. The semiconductor package 110 includes a CPU 111 and a non-volatile memory 112 and is integrated by using the application specific standard produce (ASSP). The CPU 111 and the non-volatile memory 112 correspond to semiconductor chips. The power supply LSI 120 includes a DC-DC converter 121. The semiconductor package 110 and the power supply LSI 120 are connected to perform serial communications and supply electric power from the power supply LSI 120 (specifically DC-DC converter 121) to the semiconductor package 110.

In the voltage control system 100, an operating power and a limit value of operating frequency of the semiconductor package 110 are tested after manufacture. A voltage value (VID) is determined based on the test result and stored in the non-volatile memory 112. The DC-DC converter 121 of the power supply LSI 120 is configured to, acquire the VID from the semiconductor package 110 by way of serial communications and set an input voltage to the semiconductor package 110 in accordance with the acquired VID. Thus, the voltage control system 100 saves power consumption of the semiconductor package 110.

According to the conventional technology, however, the voltage value (VID) need be stored in each semiconductor chip in a semiconductor chip test process. As a result, the semiconductor chip test process is complicated and increases cost. In case of integrating a plurality of semiconductor chips (Sip: system in package), the semiconductor chip test process is more complicated.

SUMMARY OF THE INVENTION

It is therefore an object of the present invention to provide a voltage control system circuit, which is capable of reducing electric power consumption of a semiconductor chip without complication of a test process.

According to the present invention, a voltage control system is configured with a constant voltage circuit a semiconductor package and a voltage control circuit. The semiconductor package is configured to include a semiconductor chip, in which a semiconductor device is integrated. The voltage control circuit is configured to control the constant voltage circuit based on an input voltage, which is supplied from the constant voltage circuit to the semiconductor package, and an operating voltage of the semiconductor device, which corresponds to a leak current and an operating current of the semiconductor package. The voltage control circuit is configured such that the input voltage supplied from the constant voltage circuit to the semiconductor package is decreased as a voltage difference between the input voltage and the operating voltage increases.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT (First Embodiment)

Figure 1:
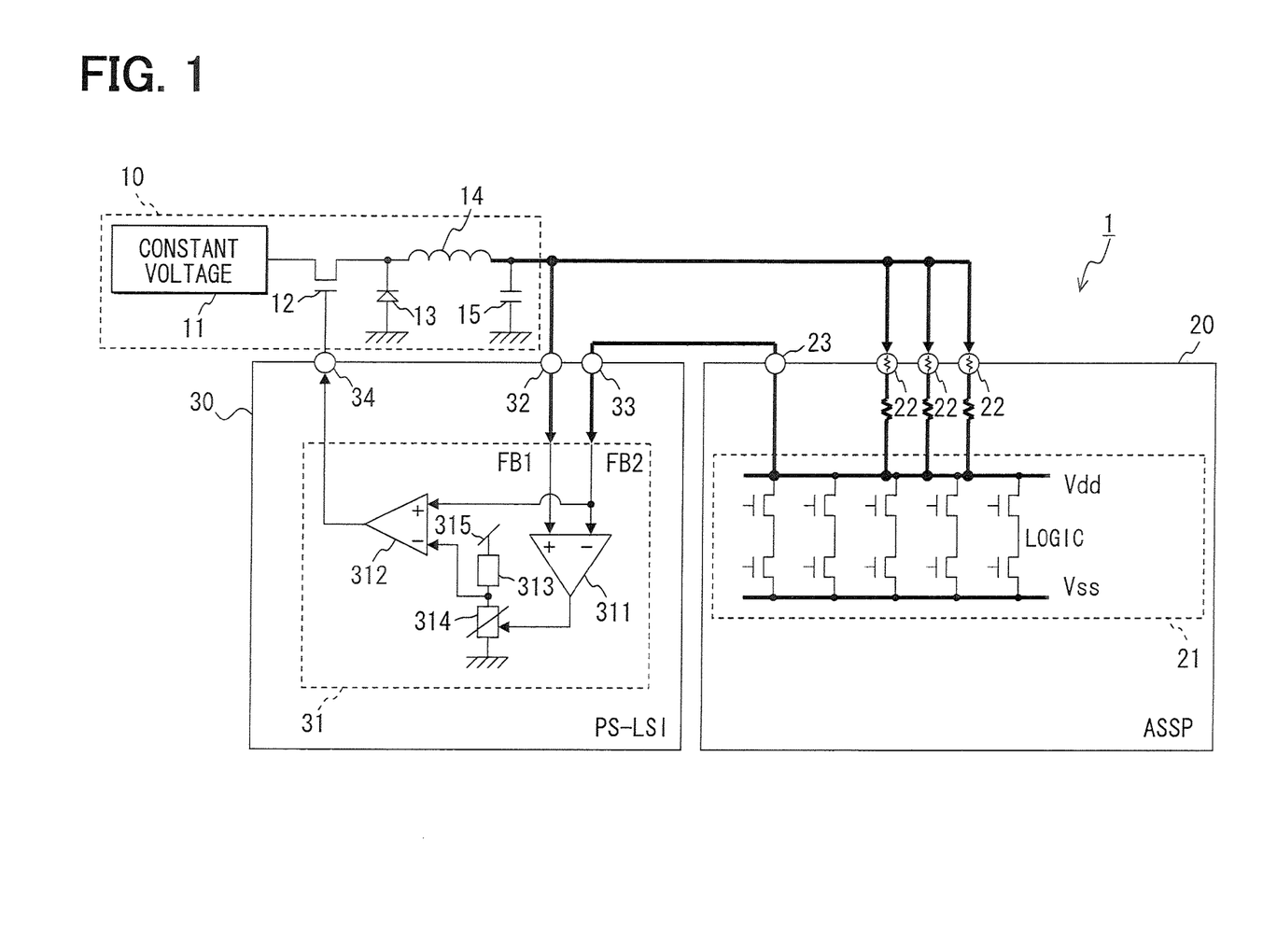
FIG. 1 is a circuit diagram showing a first embodiment of a voltage control system according to the present invention.

Referring first to FIG. 1, a voltage control system 1 includes a constant voltage circuit 10, a semiconductor package 20 and a power supply package LSI (PS-LSI) 30.

The constant voltage circuit 10 includes a constant voltage source 11, a switching element 12, a diode 13, an inductor 14 and a capacitor 15. The source 11 is a conventional voltage regulator source, which generates and supplies a constant voltage to the switching element 12. The switching element 12 is a conventional transistor and controlled to turn on and off by a control voltage applied to its gate from the power source package 30. When the switching element 12 is turned on, the constant voltage generated by the constant voltage source 11 is supplied to an external part of the constant voltage circuit 10 through the switching element 12 and the like. When the switching element 12 is turned off, the constant voltage generated by the constant voltage source 11 is not supplied to the external part of the constant voltage circuit 10. The magnitude of the constant voltage generated by the constant voltage source 11 is controlled in accordance with on-off operation of the switching element 12 and smoothed by the diode 13, the inductor 14 and the capacitor 15. Then the smoothed voltage is supplied externally from the constant voltage circuit 10 to the semiconductor package 20. The constant voltage circuit 10 is configured to be capable of setting its output voltage, which is an input voltage to the semiconductor package 20, in a range from 0.0 [V] to 2.0 [V].

The semiconductor package 20 is a general-purpose LSI, the function of which is limited for use in a specific field, and manufactured by application specific standard produce (ASSP). In the semiconductor package 20, a semiconductor chip 21, in which a semiconductor device is manufactured, is integrated. The semiconductor device includes a logic circuit, which includes a CPU, a non-volatile memory and the like for example. The semiconductor device has three power supply terminals 22 and an operating voltage monitor terminal 23.

The power supply terminals 22 are provided for supplying electric power from the constant voltage circuit 10 to the semiconductor device, for example, semiconductor chip 21 and the like. The operating voltage monitor terminal 23 is provided for monitoring an operating voltage with which the semiconductor device operates.

Since leak current flows into the semiconductor chip 21 from the constant voltage circuit 10, the input voltage supplied to the power supply terminals 22 from the constant voltage circuit 10 falls. As a result, a difference arises between the input voltage supplied to the semiconductor package 20 and the operating voltage of the semiconductor device. The operating voltage of the semiconductor device is 1.1 [V] in the first embodiment.

The terminal 23 is connected to an operating voltage monitor terminal 33 of the power source package 30 and then to an inverting input terminal of a first operational amplifier 311 as well as a non-inverting input terminal of a second operational amplifier 312. The device is thus connected to the power source package 30. Since the first operational amplifier 311 and the second operational amplifier 312 have respective high input impedances, no current flows generally between the semiconductor package 20 and the power source package 30.

The power supply package 30 is manufactured as a power-supply LSI and as a package separate from the package 20. In the power source package 30, a power source chip 31, in which a voltage control circuit is manufactured. Thus the power source chip 31 generally corresponds to the voltage control circuit. The package 30 has an input voltage monitor terminal 32, an operating voltage monitor terminal 33 and a gate driver terminal 34. The terminal 32 is provided for monitoring an input voltage supplied to the semiconductor package 20. The operating voltage monitor terminal 33 is provided for monitoring the operating voltage, with which the semiconductor device manufactured in the semiconductor chip 21 operates. The gate driver terminal 34 is provided for outputting the control voltage to the gate electrode of the switching element 12.

The voltage control circuit controls the constant voltage circuit 10 based on an input voltage FB1 of the semiconductor package 20 and an operating voltage FB2 of the semiconductor device, which is less than the input voltage FB1 by a voltage drop corresponding to the leak current and the operating current of the semiconductor chip 21. That is, the input voltage FB1 supplied to the semiconductor package 20 is decreased and increased as a voltage difference between the input voltage 931 and the operating voltage FB2 increases and decreases, respectively.

Figure 2:
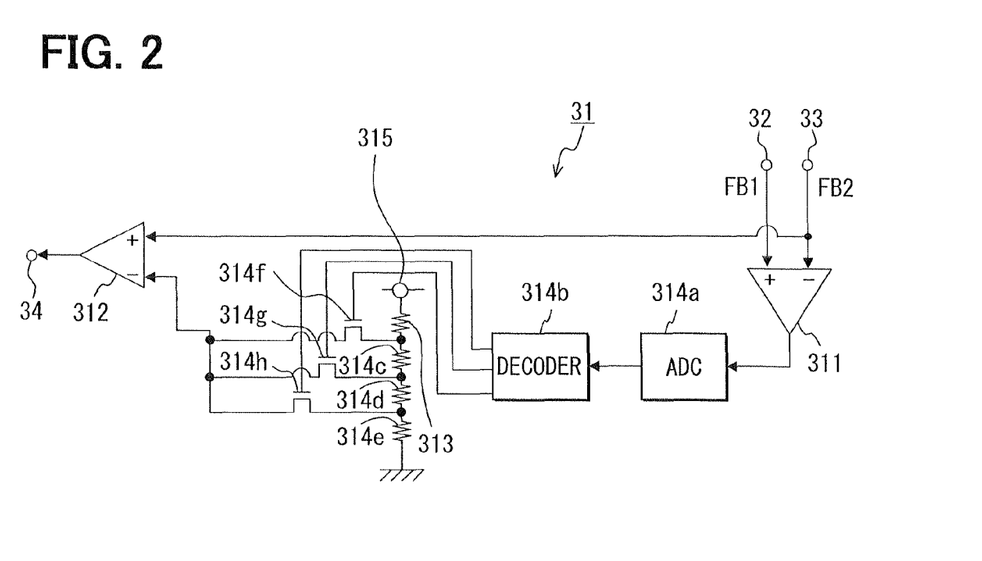
FIG. 2 is a circuit diagram showing in detail a voltage control circuit, which is manufactured as a power supply chip in the first embodiment.

The voltage control circuit is configured with a fixed resistor 313 and a variable resistor 314 in addition to the first operational amplifier 311 and the second operational amplifier 312. The voltage control circuit is shown in FIG. 1 as having only one variable resistor 314. It is however configured as having an A-D converter (ADC) 314a, a decoder 314b, fixed resistors 314c to 314e, and switching elements 314f to 314h as shown in FIG. 2 as the variable resistor 314.

The non-inverting input terminal, the inverting input terminal and the output terminal of the first operational amplifier 311 are connected to the terminal 32, the operating voltage monitor terminal 33 and the ADC 314a, respectively. The decoder 314b is connected to the ADC 314a at its pre-stage (input side) and to the switching elements 314f to 314h at its post-stage (output side). The fixed resistors 313, 314c to 314e are connected in series to an internal constant voltage source 315. The non-inverting input terminal and the output terminal of the second operational amplifier 312 are connected to the operating voltage monitor terminal 33 and the gate driver terminal 34, respectively. The inverting input terminal of the second operational amplifier 312 is connected to a junction between the fixed resistors 313 and 314c through the switching element 314f, to a junction between the fixed resistors 314c and 314d through the switching element 314g and to a junction between the fixed resistors 314d and 314e through the switching element 314h, respectively.

The first operational amplifier 311 outputs to the variable resistor 314 an output voltage, which corresponds to a voltage difference (FB1−FB2) between the input voltage FB1 of the semiconductor package 20 and the operating voltage FB2 of the semiconductor device. The input voltage FB1 and the operating voltage FB2 are inputted to the input voltage terminal 32 and the operating voltage monitor terminal 33, respectively.

More specifically, the first operational amplifier 311 outputs the output voltage corresponding to the voltage difference (FB1−FB2) to the ADC 314a and the ADC 314a converts the output voltage of the first operational amplifier 311 to a corresponding digital value, which is a discrete value (discrete voltage). The decoder 314b turns on and off the switching elements 314f to 314h in accordance with the discrete voltage of the ADC 314a inputted from the ADC 314a.

When the switching element 314f among the switching elements 314f to 314h is turned on, a first divided voltage is inputted to the inverting input terminal of the second operational amplifier 312. The first divided voltage is produced by dividing the constant voltage of the internal constant voltage source 315 by the fixed resistor 313 and the fixed resistors 314c to 314e. When the switching element 314g among the switching elements 314f to 314h is turned on, a second divided voltage is inputted to the inverting input terminal of the second operational amplifier 312. The second divided voltage is produced by dividing the constant voltage of the internal constant voltage source 315 by the fixed resistors 313 and 314c and the fixed resistors 314d and 314e, and hence lower than the first divided voltage. When the switching element 314h among the switching elements 314f to 314h is turned on, a third divided voltage is inputted to the inverting input terminal of the second operational amplifier 312. The third divided voltage is produced by dividing the constant voltage of the internal constant voltage source 315 by the fixed resistors 313, 314c and 314d and the fixed resistor 314e, and hence lower than the second divided voltage.

The output voltage of the first operational amplifier 311 increases, as the voltage difference between the input voltage FB1 and the operating voltage FB2 increases. As the output voltage of the first operational amplifier 311 increases, the divided voltage at the inverting input terminal of the second operational amplifier 312 increases proportionally. As the divided voltage at the inverting input terminal of the second operational amplifier 312 increases and approaches the operating voltage FB2, that is, a voltage difference between the operating voltage FB2 and the divided voltage decreases, the output voltage of the second operational amplifier 312, which corresponds to the control voltage for the switching element 12, decreases. When the switching element 12 is turned off due to a decrease in the control voltage, the input voltage FB1 falls.

The output voltage of the first operational amplifier 311 decreases, as the voltage difference between the input voltage FB1 and the operating voltage FB2 decreases. As the output voltage of the first operational amplifier 311 decreases, the divided voltage at the inverting input terminal of the second operational amplifier 312 decreases proportionally. As the divided voltage at the inverting input terminal of the second operational amplifier 312 decreases and deviates from the operating voltage FB2, that is, a voltage difference between the operating voltage FB2 and the divided voltage increases, the output voltage of the second operational amplifier 312, which corresponds to the control voltage for the switching element 12, increases. When the switching element 12 is turned on due to an increase in the control voltage, the input voltage FB1 rises.

Figure 3:
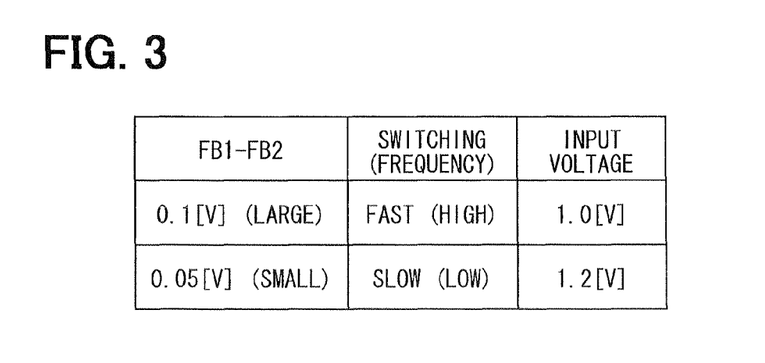
FIG. 3 is a table showing an example of input voltages, which are set by the voltage control circuit and applied to a semiconductor package, in the first embodiment.

According to the first embodiment, the voltage control circuit controls the switching element 12 as shown in FIG. 3. That is, when the voltage difference between the input voltage FB1 and the operating voltage FB2 is as large as 0.1 [V] for example, the switching element 12 is controlled to lower the operating voltage FB2 to 1.0 [V]. When the voltage difference between the input voltage FB1 and the operating voltage FB2 is as small as 0.05 [V] for example, the switching element 12 is controlled to raise the operating voltage FB2 to 1.2 [V].

As described above, the voltage difference between the input voltage FB1 and the operating voltage FB2 arises from voltage drop, which varies with magnitudes of the leak current and the operating current of the semiconductor chip 21. However, the operating current rarely varies depending variation in the semiconductor manufacturing process. Therefore, the voltage difference generally corresponds to magnitude of leak current, that is, magnitude of leak power. The constant voltage circuit 10 is controlled such that the input voltage FB1 is decreased and increased as the voltage difference increases and decreases, respectively. Thus, the voltage control circuit decreases and increases the input voltage FB1 as the semiconductor package 20 has larger leak power and smaller leak power, respectively. As a result, even if the semiconductor package 20 has large leak power; it can reduce its power consumption while maintaining generally the same limit value of operating frequency as a semiconductor package having small leak power.

The voltage control circuit thus does not require a set voltage value (VID) to be provided in the test process as opposed to the conventional technology. As a result, the test process for the semiconductor package 20 is not complicated.

(Second Embodiment)

Figure 4:
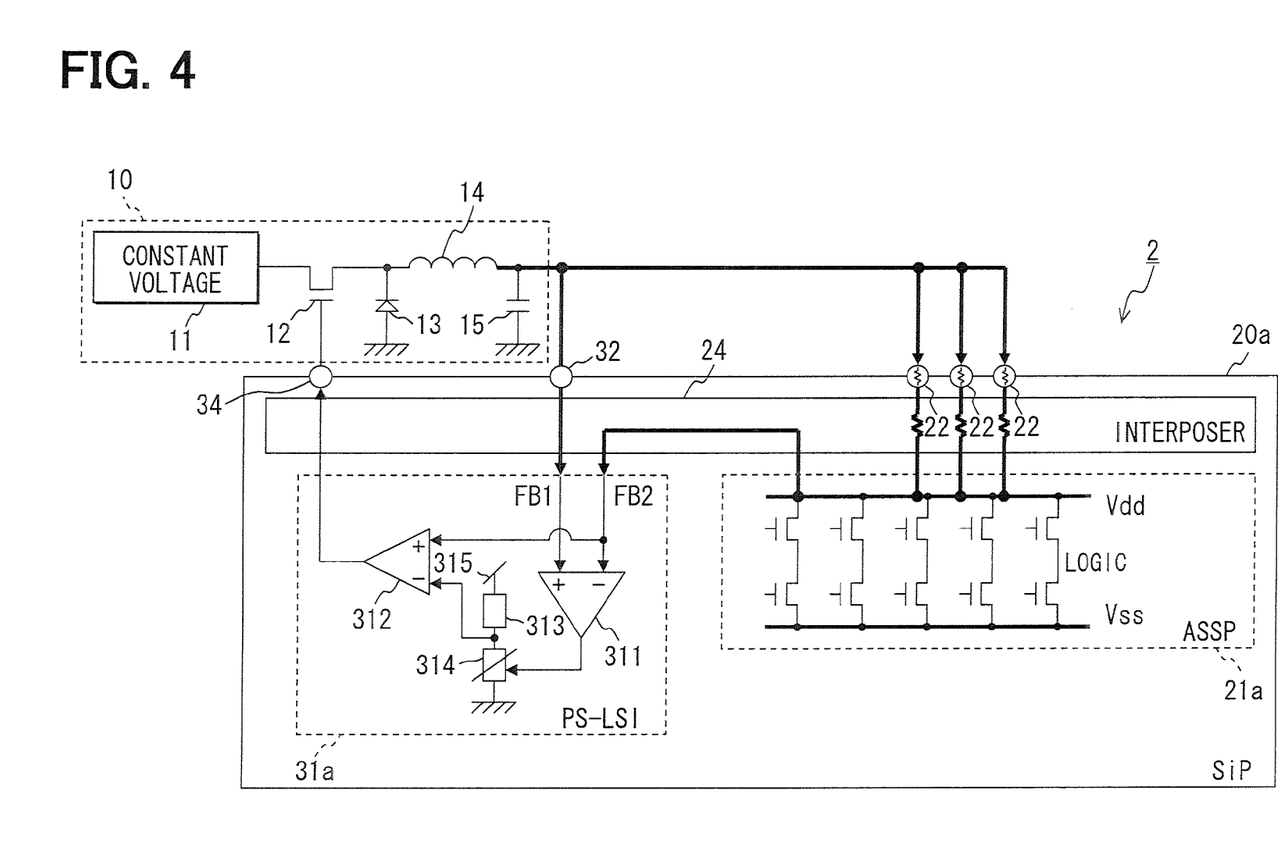
FIG. 4 is a circuit diagram showing a second embodiment of a voltage control system according to the present invention.

According to a second embodiment, as shown in FIG. 4, a voltage control system 2 is configured in the similar manner as the voltage control system 1. However, the voltage control system 2 is differentiated from the voltage control system 1 in the following points.

In the voltage control system 1, the power source chip 31 including the voltage control circuit and the semiconductor chip 21 including the semiconductor device are integrated in the power source package 30 and the semiconductor package 20, which are separate, respectively. However, in the voltage control system 2, the voltage control circuit is provided in a power source chip 31a and the power source chip 31a is integrated with a semiconductor chip 21a in a same single semiconductor package 20a thus forming SiP (system in package).

In the voltage control system 2, the voltage control circuit is formed in the power source chip 31a. In the semiconductor package 20a, the semiconductor chip 21a, the power source chip 31a and an interposer 24 are integrated as a single body. The interposer 24 electrically connects the semiconductor chip 21a and the power source chip 31a. The package 20a has the input voltage monitor terminal 32 for monitoring the input voltage FB1 supplied to the semiconductor package 20a. The power source chip 31a receives the operating voltage FB2 of the semiconductor device through the interposer 24 and also receives the input voltage FB1 of the semiconductor package 20a through the terminal 32.

According to the second embodiment, the semiconductor chip 21a and the power source chip 31a are electrically connected by the interposer 24, in the same package 20a, and hence the terminal 22 and the operating voltage monitor terminal 33 provided in the first embodiment can be obviated.

(Third Embodiment)

Figure 5:
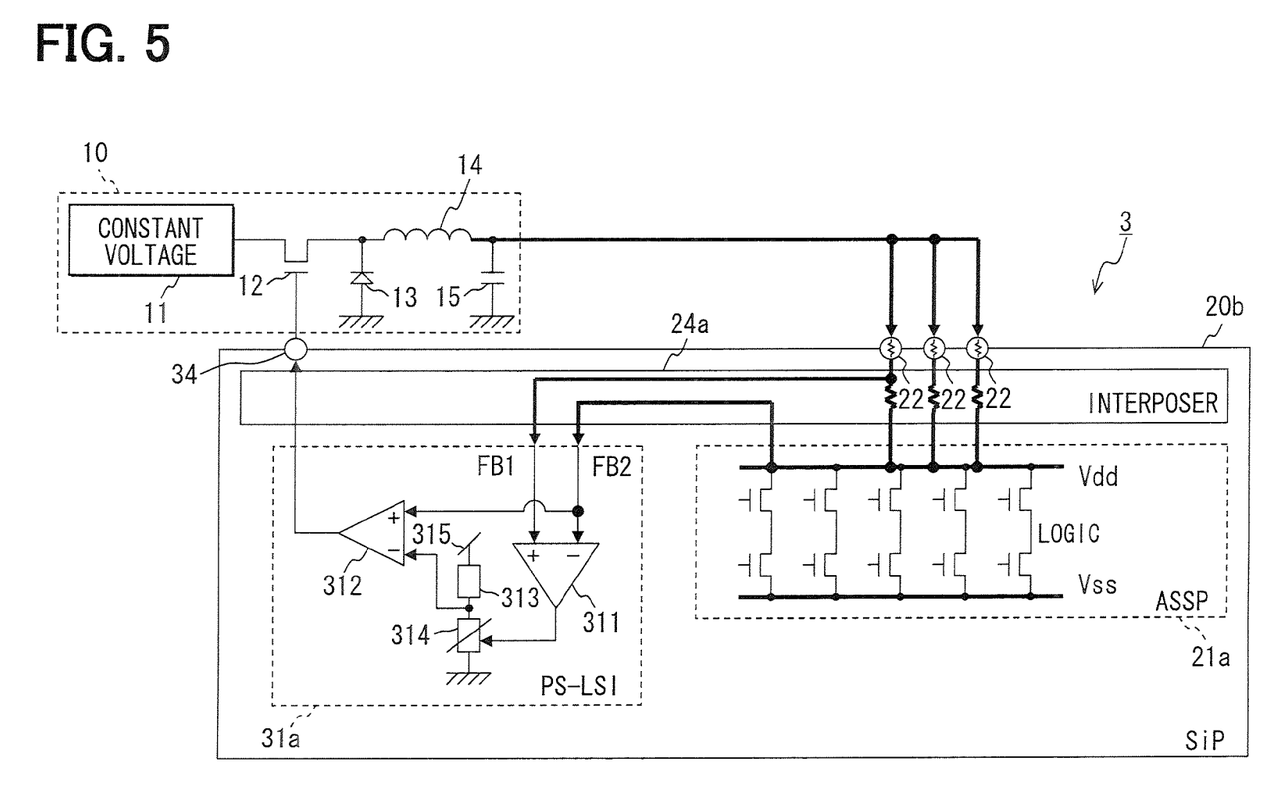
FIG. 5 is a circuit diagram showing a third embodiment of a voltage control system according to the present invention.

According to a third embodiment, as shown in FIG. 5, a voltage control system 3 is configured in the similar manner as the voltage control system 1. However, the voltage control system 3 is differentiated from the voltage control system 1 in the following points.

In the voltage control system 1, the power source chip 31 including the voltage control circuit and the semiconductor chip 21 including the semiconductor device are integrated in the power source package 30 and the semiconductor package 20, which are separate, respectively. However; in the voltage control system 3, the voltage control circuit is provided in the power source chip 31a and the power source chip 31a is integrated with the semiconductor chip 21a in a same single semiconductor package 20b, thus forming SiP (system in package), in the similar manner as in the voltage control system 2.

In the voltage control system 3, the voltage control circuit is formed in the power source chip 31a. In the semiconductor package 20b, the semiconductor chip 21a, the power source chip 31a and an interposer 24a are integrated as a single body. The interposer 24a electrically connects the semiconductor chip 21a and the power source chip 31a. The chip 31a receives the operating voltage F132 of the semiconductor device and the input voltage FB1 of the semiconductor package 20b through the interposer 24a.

According to the third embodiment, the semiconductor chip 21a and the power source chip 31a are electrically connected by the interposer 24a, the terminal 23, the terminal 32 and the operating voltage monitor terminal 33 provided in the first embodiment can be obviated.

(Fourth Embodiment)

Figure 6:
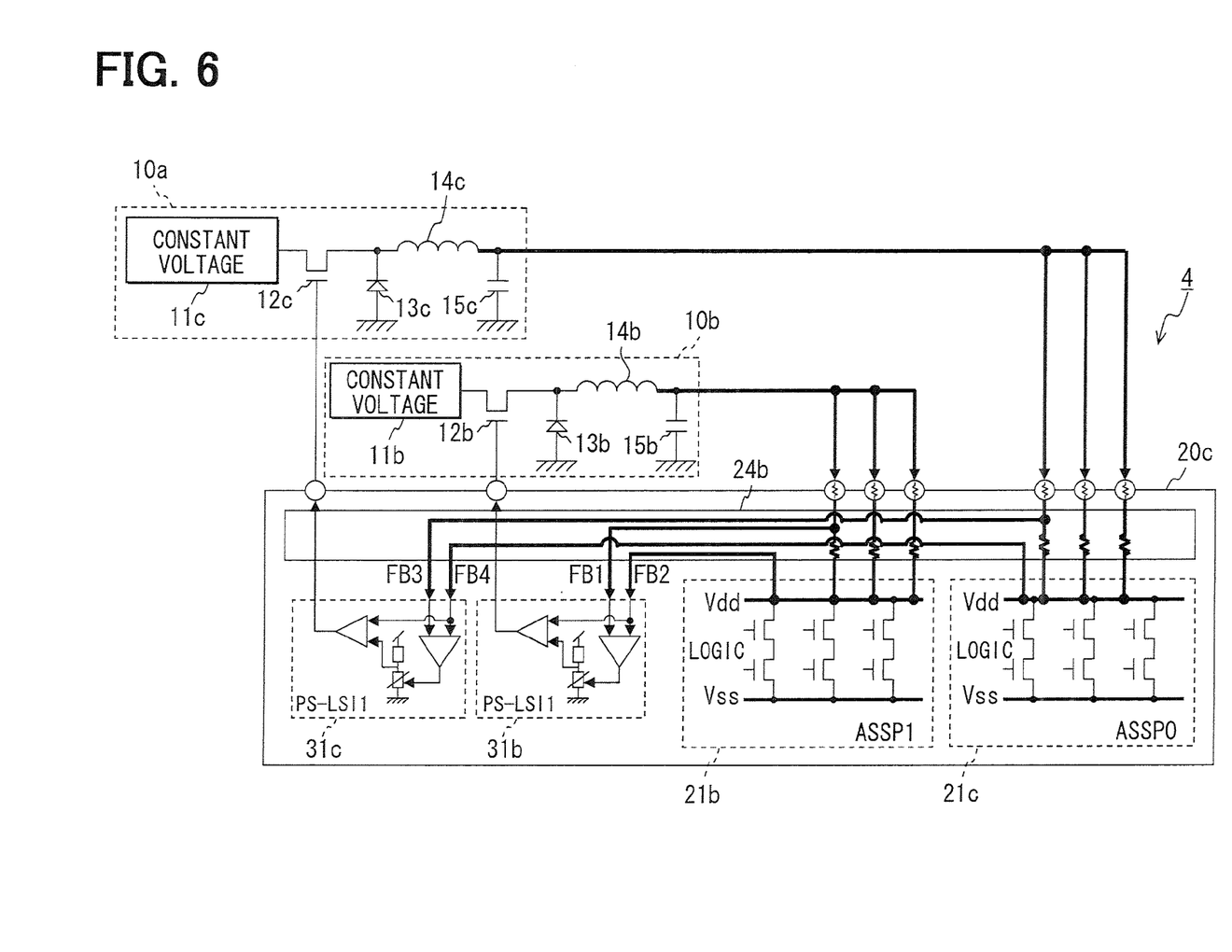
FIG. 6 is a circuit diagram showing a fourth embodiment of a voltage control system according to the present invention.
Figure 7:
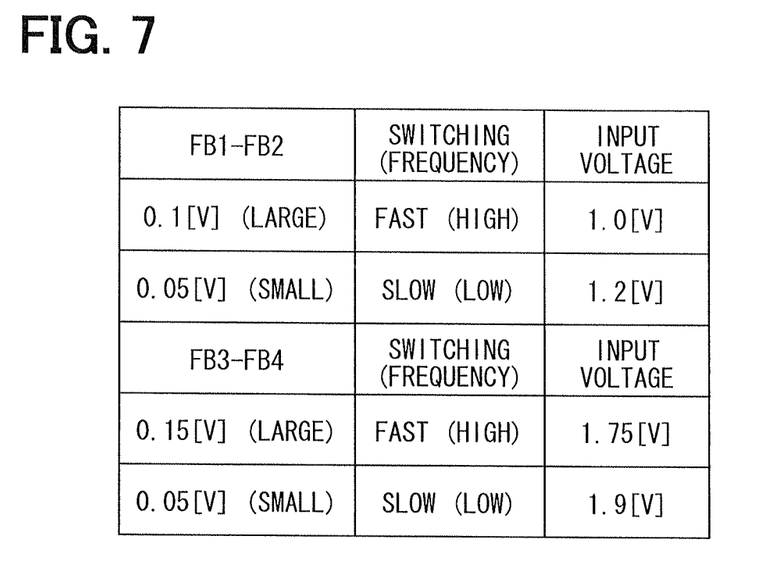
FIG. 7 is a table showing an example of input voltages, which are set by the voltage control circuit and applied to the semiconductor package, in the fourth embodiment.

According to a fourth embodiment, as shown in FIGS. 6 and 7, a voltage control system 4 is configured in the similar manner as the voltage control system 3. However; the voltage control system 4 is differentiated from the voltage control system 3 in the following points.

In the voltage control system 3, the semiconductor chip 21a and the power source chip 31a are formed in one set in the semiconductor package 20b. However, in the voltage control system 4, two semiconductor chips 21b, 21c and two power source chips 31b, 31c are formed in two sets in a single semiconductor package 20c. Two constant voltage circuits 10a and 10b are also provided in a set. Operating voltages of the semiconductor chip 21b and the semiconductor chip 21c are 1.1 [V] and L75 [V] in the fourth embodiment, respectively.

According to the fourth embodiment, the power source chip 31b controls a switching element 12b of the constant voltage circuit 10b. That is, as exemplified in FIG. 7 as one example, when the voltage difference between the input voltage FB1 and the operating voltage FB2 is as large as 0.1 [V] for example, the switching element 12b is controlled to lower the input voltage FB1 to 1.0 [V]. When the voltage difference between the input voltage FB1 and =the operating voltage FB2 is as small as 0.05 [V] for example, the switching element 12b is controlled to raise the voltage FB1 to 1.2 [V].

Further, the power source chip 31c controls a switching element 12c as shown. That is, as exemplified in FIG. 7, when the voltage difference between the input voltage FB3 and the operating voltage FB4 is as large as 0.15 [V] for example, the switching element 12c is controlled to lower the input voltage FB3 to 1.75 [V]. When the voltage difference between the input voltage FB3 and the voltage FB4 is as small as 0.05 [V] for example, the switching element 12b is controlled to raise the voltage FB3 to 1.9 [V].

If a plurality of sets of semiconductor chips and power source chips are formed in the same semiconductor package 20c, the test process is necessarily complicated and it becomes impossible to use the conventional VID. According to the voltage control system 4, however, the test process is not complicated even if the semiconductor chips 21b, 21c and the power source chips 31b, 31c are provided in two pairs in the same package 20c. In the fourth embodiment, the number of pairs of the semiconductor chip and the power source chip is not limited to two but may be more than two.

(Other Embodiments)

The voltage control system is not limited to the configurations of the first embodiment to the fourth embodiment, but may be configured differently. For example, the embodiments may be modified as follows.

The power source chip 31 includes the first operational amplifier 311 for varying the resistance of the variable resistor 314 and the second operational amplifier 312 for switching the on-off state of the constant voltage circuits 10, 10a and 10b in the first to the fourth embodiments. Alternatively, as shown in FIG. 8, the second operational amplifier 312 may be configured to switch the on-off state of the constant voltage circuits 10, 10a and 10b by receiving the input voltage FB1 and the divided voltage developed by the fixed resistor 313 and the variable resistor 314 and controlling the constant voltage circuit 10 based on these received voltages.

The power source chip 31 (including its modification) need not include the internal constant voltage source 315, the fixed resistor 313 and the variable resistor 314. The power source chip 31 may be configured differently as far as it controls the constant voltage circuit 10 such that the input voltage FB1 supplied to the semiconductor package 20 is decreased as the voltage difference between the input voltage FB1 and the operating voltage FB2 increases.

What is claimed is:

1. A voltage control system comprising:
    a constant voltage circuit;
    a semiconductor package, in which a semiconductor chip including a semiconductor device is integrated; and
    a voltage control circuit configured to control the constant voltage circuit based on an input voltage, which is supplied from the constant voltage circuit to the semiconductor package, and an operating voltage of the semiconductor device, which corresponds to a leak current and an operating current of the semiconductor package,
    wherein the voltage control circuit is configured such that the input voltage supplied from the constant voltage circuit to the semiconductor package is decreased as a voltage difference between the input voltage and the operating voltage increases.

2. The voltage control system according to claim 1, wherein:
    the voltage control circuit includes a first operational amplifier and a second operational amplifier;
    the first operational amplifier is configured to receive the input voltage and the operating voltage and output a differential voltage corresponding to the voltage difference between the input voltage and the operating voltage; and
    the second operational amplifier is configured to receive the operating voltage and a voltage varying with the differential voltage and turn on and off the constant voltage circuit based on received voltages.

3. The voltage control system according to claim 1, wherein:
the voltage control circuit includes a first operational amplifier and a second operational amplifier;
the first operational amplifier is configured to receive the input voltage and the operating voltage and output a differential voltage corresponding to the voltage difference between the input voltage and the operating voltage; and
the second operational amplifier is configured to receive the input voltage and a voltage varying with the differential voltage and turn on and off the constant voltage circuit based on received voltages.

4. The voltage control system according to claim 1, wherein:
the voltage control circuit is formed in a power source chip, which is integrated in a power source package;
the semiconductor package includes an operating voltage monitor terminal for receiving and monitoring the operating voltage of the semiconductor device; and
the power source package includes an input voltage monitor terminal for receiving and monitoring the input voltage supplied to the semiconductor package.

5. The voltage control system according to claim 1, wherein:
the voltage control circuit is formed in a power source chip;
the semiconductor package includes the semiconductor chip, the power source chip and an interposer, all of which are integrated in a single package, the interposer connecting the semiconductor chip and the power source chip;
the semiconductor package includes an input voltage monitor terminal for receiving and monitoring the input voltage of the semiconductor device; and
the power source chip is configured to receive the operating voltage of the semiconductor device through the interposer and receive the input voltage supplied to the semiconductor package through the input voltage monitor terminal.

6. The voltage control system according to claim 1, wherein:
the voltage control circuit is formed in a power source chip;
the semiconductor package includes the semiconductor chip, the power source chip and an interposer, all of which are integrated in a single package, the interposer connecting the semiconductor chip and the power source chip; and
the power source chip is configured to receive both the operating voltage of the semiconductor device and the input voltage of the semiconductor package through the interposer.

* * * * *